United States Patent
Mino et al.

(10) Patent No.: US 7,253,494 B2
(45) Date of Patent: Aug. 7, 2007

(54) BATTERY MOUNTED INTEGRATED CIRCUIT DEVICE HAVING DIFFUSION LAYERS THAT PREVENT CATIONS SERVING TO CHARGE AND DISCHARGE BATTERY FROM DIFFUSING INTO THE INTEGRATED CIRCUIT REGION

(75) Inventors: Shinji Mino, Ibaraki (JP); Hironori Ishii, Hirakata (JP); Masaya Ugaji, Suita (JP); Yasuyuki Shibano, Sakai (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/541,465

(22) PCT Filed: Apr. 2, 2004

(86) PCT No.: PCT/JP2004/004881

§ 371 (c)(1),
(2), (4) Date: Jul. 6, 2005

(87) PCT Pub. No.: WO2004/090982

PCT Pub. Date: Oct. 21, 2004

(65) Prior Publication Data

US 2006/0113652 A1    Jun. 1, 2006

(30) Foreign Application Priority Data

Apr. 4, 2003    (JP) .............................. 2003-101251

(51) Int. Cl.
*H01L 29/00* (2006.01)
(52) U.S. Cl. ..................................... 257/528
(58) Field of Classification Search ................ 257/347, 257/724, 798, 924, 528, 796; 438/149, 479, 438/517, 107

See application file for complete search history.

(56) References Cited

U.S. PATENT DOCUMENTS 4,965,151 A    10/1990    Takada et al.

(Continued)

FOREIGN PATENT DOCUMENTS

| JP | 10284130 | 10/1988 |
|----|----------|---------|
| JP | 03011763 | 1/1991 |
| JP | 06153412 | 5/1994 |
| JP | 2002057037 | 2/2002 |
| JP | 2003133420 | 5/2003 |

OTHER PUBLICATIONS

Dallas Semiconductor MAXIM application note 653. Circuit Tradeoffs Minimize Noise in Battery-Input Power Supplies, 8 pages, Jan. 22, 2001.*

(Continued)

*Primary Examiner*—Sara Crane
*Assistant Examiner*—Ajay Arora
(74) *Attorney, Agent, or Firm*—Stevens, Davis, Miller & Mosher, LLP

(57) ABSTRACT

The present invention relates to a battery mounted integrated circuit device where an integrated circuit and a solid state battery are formed on the same substrate. In this battery mounted integrated circuit device, a first diffusion layer containing an N-type impurity is formed between a region of a semiconductor substrate where the solid state battery is mounted and a region of the semiconductor substrate where the integrated circuit is mounted, and a second diffusion layer containing an N-type impurity is formed below the region of the semiconductor substrate where the solid state battery is mounted, and overlaps with the first diffusion layer.

5 Claims, 5 Drawing Sheets

U.S. PATENT DOCUMENTS

| | | | | |
|---|---|---|---|---|
| 5,338,625 A | * | 8/1994 | Bates et al. | 429/322 |
| 5,864,182 A | | 1/1999 | Matsuzaki | |
| 6,020,614 A | * | 2/2000 | Worley | 257/349 |
| 6,349,067 B1 | * | 2/2002 | Hsu et al. | 365/206 |
| 6,633,073 B2 | * | 10/2003 | Rezvani et al. | 257/504 |

OTHER PUBLICATIONS

Ariel, Nava et al, "Microelectronically fabricated LiCoO2/SiO2/polycrystalline-silicon power cells planarized by chemical mechanical polishing", American Vacuum Society J. Vac. Sci. Technol. B 24 (2), Mar./Apr. 2006, p. 562-569.*

PCT International Search Report dated Jul. 20, 2004.

* cited by examiner (1)

(2)

(3)

(4)

(5)

(6)

(7)

(8)

(9)

(10)

(11)

(12)

(13)

(14)

BATTERY MOUNTED INTEGRATED CIRCUIT DEVICE HAVING DIFFUSION LAYERS THAT PREVENT CATIONS SERVING TO CHARGE AND DISCHARGE BATTERY FROM DIFFUSING INTO THE INTEGRATED CIRCUIT REGION

TECHNICAL FIELD

The present invention relates to a battery mounted integrated circuit device constituted by the coexistence of an integrated circuit and a solid state battery.

BACKGROUND ART

In recent years, with size reduction in electronic devices, an all-solid state battery has been formed together with semiconductor devices on a semiconductor substrate. In such a semiconductor substrate, in some cases, ions which serve to charge/discharge a solid state battery, e.g. lithium ions, diffuse to the semiconductor substrate. When those ions having diffused in the semiconductor substrate reach semiconductor devices, there are possibilities that the characteristics of the semiconductor devices deteriorate or the semiconductor devices improperly operate.

Regarding such a battery mounted integrated circuit device as described above where semiconductor devices and a solid state battery are formed on the same semiconductor substrate, as a method for reducing an influence on the semiconductor substrate exerted by ions serving to charge/discharge the solid state battery, it has been proposed that a diffusion layer be formed by doping an N-type impurity into the semiconductor substrate directly under the solid state battery, and this diffusion layer be applied with a potential not lower than a potential of a positive electrode of the solid state battery (Japanese Laid-Open patent Publication No. 2003-133420).

The diffusion layer applied with a potential not lower than the potential of the positive electrode of the solid state battery can prevent positive ions serving to charge/discharge the solid state battery, e.g. lithium ions, from diffusing into the semiconductor substrate. This can prevent the ions serving to charge/discharge the solid state battery from causing deterioration in characteristics of the semiconductor devices and improper operations of the semiconductor devices.

However, in the configuration as described above, a contact resistance between the diffusion layer and an electrode for applying a potential increases when a potential higher than the potential of the positive electrode of the solid state battery is applied. In order to reduce this contact resistance, it is necessary to increase the concentration of the N-type impurity in the diffusion layer directly under the solid state battery.

When the area of the solid state battery occupied on the substrate is small, a region for the diffusion layer to be formed can be made small. This can decrease an amount of the N-type impurity required to increase the concentration of the N-type impurity in the diffusion layer. However, when the area of the solid state battery occupied on the substrate is large, the region for the diffusion layer to be formed increases. This leads to an increase in amount of the N-type impurity required for increasing the concentration of the N-type impurity in the diffusion layer. Further, with the increase in amount of the N-type impurity required, the time required for the formation of the diffusion layer also increases. As thus described, a problem of lowering the production efficiency may arise as the solid state battery formed on the semiconductor substrate becomes larger.

Accordingly, an object of the present invention is to provide a battery mounted integrated circuit device capable of effectively preventing deterioration in characteristics of semiconductor devices and improper operation of the semiconductor devices, without using a large amount of N-type impurity.

DISCLOSURE OF INVENTION

The present invention relates to a battery mounted integrated circuit device, comprising: (1) a semiconductor substrate; (2) a solid state battery mounted on the semiconductor substrate; (3) an integrated circuit mounted on the semiconductor substrate; (4) a first diffusion layer, containing an N-type impurity, formed between a region of the semiconductor substrate where the solid state battery is mounted and a region of the semiconductor substrate where the integrated circuit is mounted; and (5) a second diffusion layer, containing an N-type impurity, formed below the region of the semiconductor substrate where the solid state battery is mounted, and overlapping with the first diffusion layer. The solid state battery comprises a positive electrode, a negative electrode, and a solid electrolyte disposed between the positive electrode and the negative electrode, and the concentration of the N-type impurity in the first diffusion layer is higher than the concentration of the N-type impurity in the second diffusion layer.

It is preferable in the battery mounted integrated circuit device that the concentration of the N-type impurity in the first diffusion layer be not less than $1 \times 10^{19}$ atoms/cm$^3$.

It is further preferable in the battery mounted integrated circuit device that the ratio of the concentration of the N-type impurity in the first diffusion layer to the concentration of the N-type impurity in the second diffusion layer be not more than $1 \times 10^5$.

It is further preferable in the battery mounted integrated circuit device that the first diffusion layer and the second diffusion layer have a positive potential.

It is preferable that the positive potential be not less than a potential of the positive electrode with respect to the negative electrode.

It is preferable in the battery mounted integrated circuit device that the first diffusion layer surrounds the region where the solid state battery be mounted.

It is preferable that the battery mounted integrated circuit device further comprise a wiring layer for connecting the first diffusion layer with the outside.

It is preferable that the battery mounted integrated circuit device further comprise a potential controlling part for controlling a potential to be applied to the first diffusion layer and the second diffusion layer.

BEST MODE FOR CARRYING OUT THE INVENTION

In the following, a battery mounted integrated circuit device of the present invention is described with reference to drawings.

EMBODIMENT 1

Figure 1:
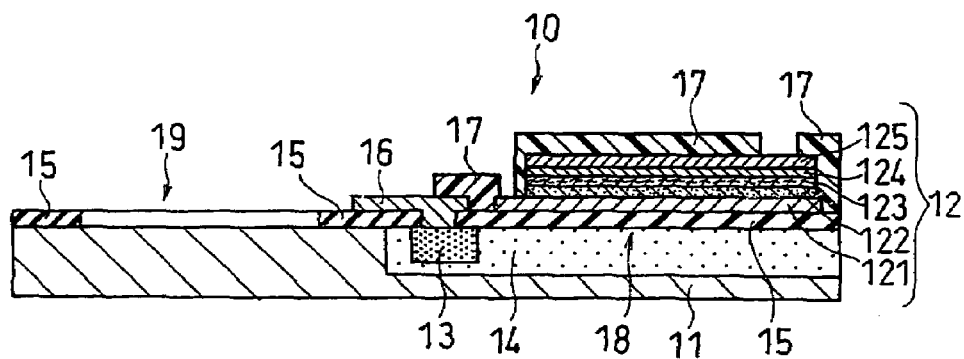
FIG. 1 is a vertical sectional view showing a main part of a battery mounted integrated circuit device in accordance with one embodiment of the present invention.

FIG. 1 shows a battery mounted integrated circuit device in accordance with one embodiment of the present invention.

The battery mounted integrated circuit device 10 in FIG. 1 comprises a semiconductor substrate 11, and a solid state battery 12 and an integrated circuit (not shown) which are mounted on the semiconductor substrate 11. The battery mounted integrated circuit device 10 further comprises a first diffusion layer 13 containing an N-type impurity, formed between a region 18 of the semiconductor substrate 11 where the solid state battery 12 is mounted and a region 19 of the semiconductor substrate 11 where the integrated circuit is mounted, and a second diffusion layer 14 containing an N-type impurity formed below the region 18 of the semiconductor substrate 11 where the solid state battery 12 is mounted. Herein, an insulating layer 15 is formed on the surface of the semiconductor substrate 11. Further, a wiring layer 16 formed on the semiconductor substrate 11 is connected to the first diffusion layer 13. The first diffusion layer 13 and the second diffusion layer 14 are overlapped. The first diffusion layer 13 may be formed in the second diffusion layer 14.

The solid state battery 12 comprises a negative electrode current collector film 121, a negative electrode film 122, a solid electrolyte film 123, a positive electrode film 124 and a positive electrode current collector film 125, which are successively layered on the semiconductor substrate 11. The positions of the positive electrode and the negative electrode may be reversed.

In the present embodiment, the solid state battery 12 is protected by a surface protective layer 17.

Various kinds of materials can be used for the semiconductor substrate 11. For example, a silicon substrate can be cited.

As the insulating layer 15 on the surface of the semiconductor substrate 11, those capable of insulating the semiconductor substrate 11 and the negative electrode current collector film 121 can be used. Examples of the insulating layer 15 include a material comprising a silicon oxide film and materials comprising silicon nitride, alumina, quartz, and resins such as polyimide.

In the case of forming a silicon oxide film as the insulating layer on a semiconductor substrate, for example, a plasma CVD method is employed to form an insulating layer, comprising a silicon oxide film, on a semiconductor substrate. The silicon oxide film can secure the insulating property thereof when having a thickness of about 500 Å.

As the N-type impurity, a pentavalent element such as phosphorous or arsenic can be used.

As the negative electrode current collector film 121, a film comprising a negative electrode current collector material capable of forming a thin film can be employed. Examples of the negative electrode current collector material include copper and nickel.

As the negative electrode film 122, a film comprising a negative electrode material capable of forming a thin film can be used. Examples of the negative electrode include graphite and lithium.

As the positive electrode 124, a film comprising a positive electrode material capable of forming a thin film can be used. Examples of the positive electrode material include $LiCoO_2$ and $LiMn_2O_4$.

As the positive electrode current collector film 125, a film comprising a positive electrode current collector material capable of forming a thin film can be employed. Examples of the positive electrode current collector material include aluminum and nickel.

As the solid electrolyte film 123, a lithium-ion conductive solid electrolyte, a silver-ion conductive solid electrolyte, a copper-ion conductive solid electrolyte, and the like can be used according to the electrode materials.

As the lithium-ion conductive solid electrolyte used can be $Li_2S$—$SiS_2$, $Li_3PO_4$—$Li_2S$—$SiS_2$, $LiI$—$Li_2S$—$SiS_2$, $LiI$, $LiI$-$Al_2O_3$, $Li_3N$, $Li_3N$—$LiI$—$LiOH$, $Li_2O$—$SiO_2$, $Li_2O$—$B_2O_3$, $LiI$—$Li_2S$—$P_2O_5$, $LiI$—$Li_2S$—$B_2S_3$, $Li_{3.6}Si_{0.6}P_{0.4}O_4$, $LiI$—$Li_3PO_4$—$P_2S_5$, and the like. Further, an organic dry polymer, such as polyethylene oxide, can be used as the lithium-ion conductive solid electrolyte.

When the lithium-ion conductive solid electrolyte is used, compounds commonly used for lithium batteries such as $Li_xCoO_2$, $Li_xNiO_2$, $Li_xMn_2O_4$, $Li_xTiS_2$, $Li_xMoS_2$, $Li_xMoO_2$, $Li_xV_2O_5$, $Li_xV_6O_{13}$, metallic lithium and $Li_{3/4}Ti_{5/3}O_4$, can be used as the electrode material by combining those so as to obtain a desired battery voltage. It is to be noted that in the above compounds, $0<x<2$ should be satisfied.

As the copper-ion conductive solid electrolyte used can be $RbCu_4I_{1.5}Cl_{3.5}$, $CuI$—$Cu_2O$—$MoO_3$, $Rb_4Cu_{16}I_7Cl_{13}$ and the like.

When a copper-ion conductive material is used as the solid electrolyte, metallic Cu, $Cu_2S$, $Cu_xTiS_2$, $Cu_2Mo_6S_{7.8}$ and the like can be used as the electrode material.

As the silver-ion conductive solid electrolyte used can be $\alpha$-$AgI$, $Ag_6I_4WO_4$, $C_6H_5NHAg_5I_6$, $AgI$—$Ag_2O$—$MoO_3$, $AgI$—$Ag_2O$—$B_2O_3$, $AgI$—$Ag_2O$—$V_2O_5$ and the like.

When the silver-ion conductive solid electrolyte is used, metallic Ag, $Ag_{0.7}V_2O_5$, $Ag_xTiS_2$ and the like can be used as the electrode material.

The negative electrode current collector film, the positive electrode current collector film, the negative electrode film, the positive electrode film and the solid electrolyte film can be produced by the vacuum deposition method, the sputtering method and the like.

As the wiring layer 16, a layer comprising a conductive material can be used. Aluminum and the like can be cited as this conductive material Next, the first diffusion layer 13 and the second diffusion layer 14 are described.

As thus described, the first diffusion layer 13 is disposed between the region of the semiconductor substrate where the solid state battery is mounted and the region of the semiconductor substrate where the integrated circuit is mounted, and the second diffusion layer 14 is disposed below the region where the solid state battery is mounted. Further, the first diffusion layer 13 and the second diffusion layer 14 are overlapped. In such a configuration, when a positive potential is applied to the first diffusion layer 13 through the wiring layer, a potential in the second diffusion layer below the region of the semiconductor substrate where the solid state battery is mounted also becomes positive.

In the case of a lithium solid state battery, for example, lithium ions as cations serve to charge/discharge the solid state battery. Since potentials of the first diffusion layer 13 and the second diffusion layer 14 are positive, the lithium ions as cations are electrically repulsive to the first diffusion layer 13 and the second diffusion layer 14. This enables prevention of the lithium ions from diffusing beyond the first diffusion layer 13 and the second diffusion layer 14 into the entire semiconductor substrate. Therefore, even when a pinhole, a crack or the like has been created in the current collector film 121 or the insulating layer 15, it is possible to prevent cations serving to charge/discharge a solid state battery, such as lithium ions, from diffusing from the solid state battery to the circuit-formed region when the solid state battery is charged/discharged.

Further, in the present invention, the concentration of the N-type impurity in the first diffusion layer is higher than the concentration of the N-type impurity in the second diffusion layer. This can reduce the contact resistance between the wiring layer 16 and the first diffusion layer 13 connected to the wiring layer 16. It is thereby possible, unlike the conventional configuration, to apply a positive potential to the second diffusion layer 14 through the first diffusion layer.

As thus described, the disposition of the first diffusion layer 13 having a higher concentration of the N-type impurity eliminates the necessity to increase the concentration of the N-type impurity in the second diffusion layer 14, and the amount of the N-type impurity to be used can thereby be reduced.

Moreover, the concentration of the N-type impurity in the first diffusion layer is preferably from $1\times10^{19}$ atoms/cm$^3$ to $1\times10^{23}$ atoms/cm$^3$, and further preferably from $1\times10^{20}$ atoms/cm$^3$ to $1\times10^{22}$ atoms/cm$^3$. When the concentration of the N-type impurity in the first diffusion layer is not less than $1\times10^{19}$ atoms/cm$^3$, it is possible to suppress fluctuation of the potential in the first diffusion layer.

On the other hand, when the concentration of the N-type impurity in the first diffusion layer is more than $1\times10^{23}$ atoms/cm$^3$, it becomes necessary to further increase the concentration of the N-type impurity in the second diffusion layer, which undesirably causes an increase in amount of the N-type impurity to be used.

Furthermore, the ratio of the concentration of the N-type impurity in the first diffusion layer to the concentration of the N-type impurity in the second diffusion layer is preferably from $1\times10^1$ to $1\times10^5$, and more preferably from $1\times10^2$ to $1\times10^3$.

When the ratio of the concentration of the N-type impurity in the first diffusion layer to the concentration of the N-type impurity in the second diffusion layer is not less than $1\times10^1$, in the case where a solid state battery comprising a unit cell is mounted, diffusion of the cations in the semiconductor substrate can be prevented with certainty, thereby allowing the battery mounted integrated circuit device to have high reliability.

On the other hand, when the above concentration ratio exceeds $1\times10^5$, the breakdown voltage of the first diffusion layer 13 or the second diffusion layer 14 decreases, and a desired voltage cannot thus be applied.

The N-type impurity contained in the first diffusion layer and the N-type impurity contained in the second diffusion layer may be the same kind of elements, or different kinds of elements. Further, plural kinds of pentavalent elements may be mixed and then used as the N-type impurity.

The sizes as well as depths of the first diffusion layer 13 and the second diffusion layer 14 are decided as appropriate according to the size of a semiconductor substrate to be used, the size of a solid state battery to be mounted on the semiconductor substrate, and the like.

It is preferable that the positive potential to be applied to the first diffusion layer 13 and the second diffusion layer 14 be a potential not lower than the potential in the positive electrode with reference to the negative electrode. This is because the ions serving to charge/discharge the secondary battery, for example, alkali metal ions such as Li$^+$ ions, out from the positive electrode, tend to be attracted to an area, such as the negative electrode, where a potential is lower than in the positive electrode.

Further, the positive potential not lower than the potential in the positive electrode with reference to the negative electrode may be applied only when the solid state battery is charged/discharged, or may be applied on a steady basis. For example, the positive potential can be applied to the breakdown voltage of the first diffusion layer 13 or the second diffusion layer 14, if the characteristics of the battery and the semiconductor circuit would not be affected.

As a power source for the application of the positive potential, the above solid state battery may be used, or a different power source may be used.

Further, in the present invention, in place of the solid state battery 12 comprising a unit cell, a battery obtained by connecting in series or parallel solid state batteries each comprising a plurality of unit cells stacked or solid state batteries each comprising a unit cell, may be used. In this case, since a voltage of the solid state battery varies depending on the number of unit cells stacked, or the like, it is preferable that positive potential higher than the voltage of this solid state battery be applied to the first diffusion layer 13 and the second diffusion layer 14.

Controlling the positive potential in the above described manner may be conducted by a potential controlling part. In this case, the magnitude of the positive potential can be controlled by previously setting to the potential controlling part the magnitude of the positive potential to be applied to the diffusion layers 13 and 14. The potential in the positive electrode with reference to the negative electrode may be detected and the positive potential not lower than the detected potential may be applied. Herein, the potential controlling part may comprise a power source section for applying the positive potential.

Moreover, the positive potential may be applied to the diffusion layers 13 and 14 on a steady basis by the potential controlling part; the positive potential may be applied to the diffusion layers 13 and 14 only when the solid state battery is charged/discharged. Further, this potential controlling part may be disposed either in or outside of the battery mounted integrated circuit device.

Next, one example of methods for producing the first diffusion layer 13 and the second diffusion layer 14 is shown.

The first-diffusion layer 13 including the N-type impurity can be formed for example by ion implantation of the N-type impurity between the integrated circuit mounted region and the solid state battery mounted region when an integrated circuit comprising semiconductor devices is formed on a semiconductor substrate. For example, the first diffusion layer having a width of 0.5 mm and a thickness of 0.2 µm can be formed under the implantation conditions of an accelerating voltage of the N-type impurity of 40 keV, and a doze amount thereof of $4.0\times10^{15}$/cm$^2$.

The second diffusion layer 14 including the N-type impurity can be formed, for example, as follows. Before the first diffusion layer is formed, ion implantation of the N-type impurity is performed in the solid state battery mounted region. The implantation conditions are, for example, an accelerating voltage of the N-type impurity of 100 keV, and a doze amount thereof of $5.0\times10^{15}$/cm$^2$. Subsequently, heat treatment is conducted at 1000° C. for 60 minutes. Accordingly, the second diffusion layer 14 having a width of 10 mm and a thickness of 3 µm can be formed.

As thus described, because the second diffusion layer 14 requires the heat treatment, it is preferably formed before the formation of the first diffusion layer.

Moreover, the concentration of the N-type impurity in the first diffusion layer 13 and the second diffusion layer 14 can be controlled as appropriate by adjusting the accelerating voltage and the doze amount of the N-type impurity when the first diffusion layer 13 and the second diffusion layer 14 are formed.

EMBODIMENT 2

Figure 2:
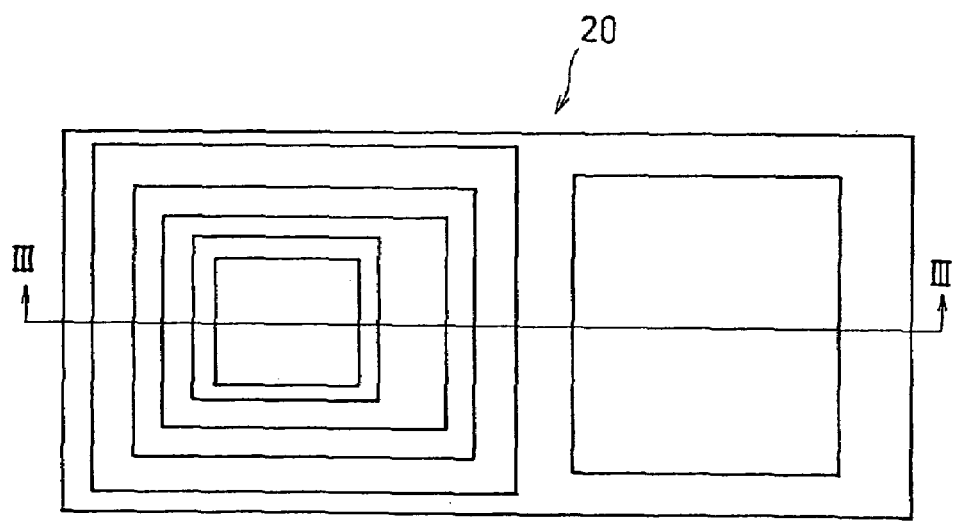
FIG. 2 is a plan view of a battery mounted integrated circuit device in accordance with another embodiment of the present invention.
Figure 3:
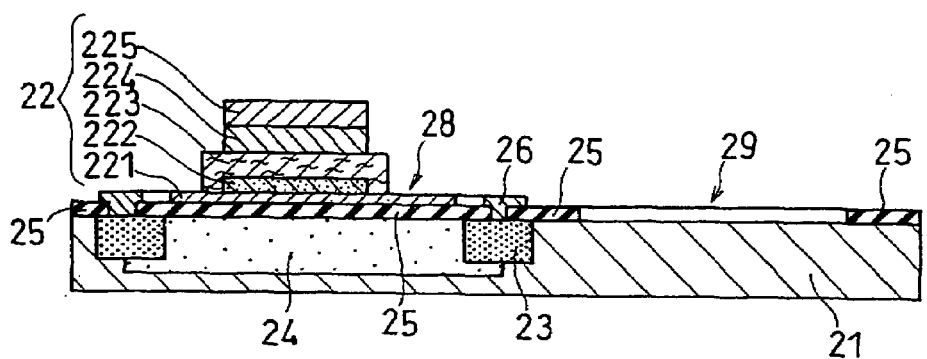
FIG. 3 is a sectional view cut along the line III-III of FIG. 2.

A description is given to a battery mounted integrated circuit device, where the first diffusion layer is formed so as to surround the region where the solid state battery is mounted, with reference to FIGS. 2 and 3.

In the battery mounted integrated circuit device 20 in FIG. 2, a solid state battery 22 and an integrated circuit (not shown) are mounted on a semiconductor substrate 21. As shown in FIG. 3, a first diffusion layer 23 containing an N-type impurity is formed between a region 28 of the semiconductor substrate 21 where the solid state battery 22 is mounted and a region 29 of the semiconductor substrate 21 where the integrated circuit is mounted. Further, a second diffusion layer 24 containing the N-type impurity is formed below the region 28 of the semiconductor substrate 21 where the solid state battery 22 is mentioned. Herein, as in the case of Embodiment 1 above, the insulating layer 25 is formed on the surface of the semiconductor substrate 21. Further, the wiring layer 26 formed on the semiconductor substrate 21 is connected to the first diffusion layer 23. The first diffusion layer 23 and the second diffusion layer 24 are overlapped. The first diffusion layer 23 may be formed in the second diffusion layer 24.

Also in the present embodiment, the concentration of the N-type impurity in the first diffusion layer 23 is higher than the concentration of the N-type impurity in the second diffusion layer 24. Further, the concentration of the N-type impurity in the first diffusion layer 23, and the ratio of the concentration of the N-type impurity in the first diffusion layer 23 to the concentration of the N-type impurity in the second diffusion layer 24 are the same as in the case of Embodiment 1 above.

The solid state battery 22 comprises a negative electrode current collector film 221, a negative electrode film 222, a solid electrolyte film 223, a positive electrode film 224 and a positive electrode current collector film 225 which are successively stacked on the semiconductor substrate 21. The positions of the positive electrode and the negative electrode may be reversed.

For the semiconductor substrate 21, the solid state battery 22, the N-type impurity and the like, the same materials as in Embodiment 1 above can be used.

In the present embodiment, the first diffusion layer 23 is formed so as to surround the region where the solid state battery is mounted. With this configuration, not only a potential directly under the solid state battery, but a potential at the periphery of the solid state battery can be made positive by applying a potential not lower than the potential of the positive electrode with reference to the negative electrode. It is thereby possible to control movement of ions serving to charge/discharge the solid state battery from the region surrounded by the first diffusion layer 23, and also to freely dispose an integrated circuit on the periphery of the region.

Further, the positive potential not lower than the potential of the positive electrode with reference to the negative electrode may be applied only when the solid state battery is charged/discharged, or may be applied on a steady basis. Moreover, the positive potential can be controlled by means of the potential controlling part as in Embodiment 1 above.

The sizes as well as the depths of the first diffusion layer 13 and the second diffusion layer 14 are decided as appropriate according to the size of a semiconductor substrate to be used, the size of a solid state battery to be mounted on the semiconductor substrate, and the like, as in Embodiment 1 above.

In the following, the present invention is described based on examples.

EXAMPLE 1

The battery mounted integrated circuit device as shown in FIG. 1 was produced by the processes shown in FIGS. 4A to 4D. FIGS. 4A to 4D mainly show production methods of the first diffusion layer, the second diffusion layer and the solid state battery.

Figure 4A:
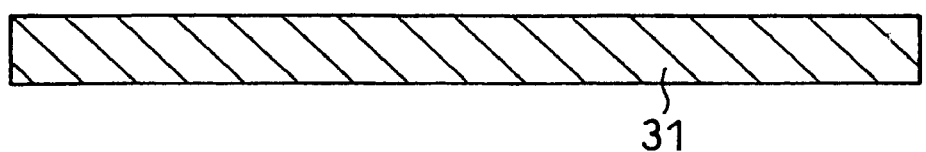
FIG. 4A, FIG. 4B, FIG. 4C and FIG. 4D are vertical sectional views showing the process for producing the battery mounted integrated circuit device in FIG. 1.
Figure 4A:
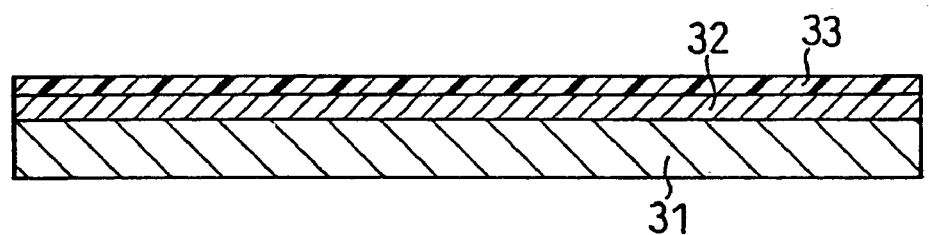
Figure 4A:
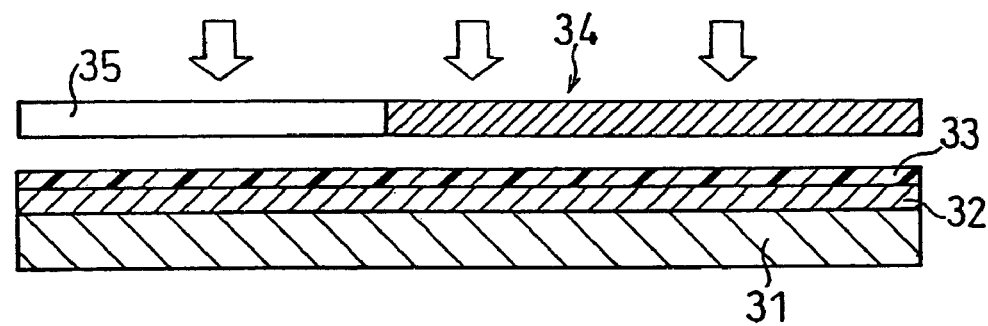
Figure 4A:
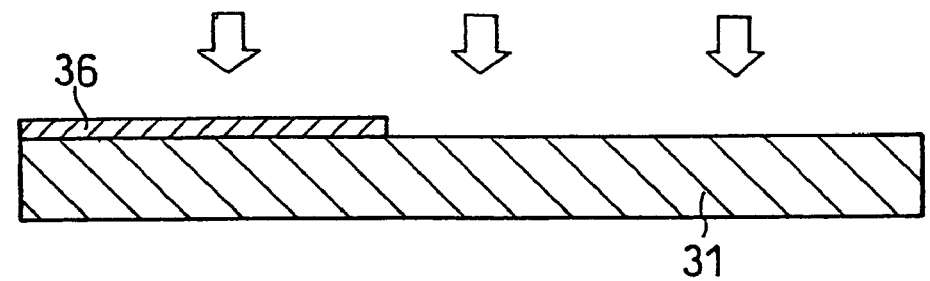

On a silicon substrate 31 shown in FIG. 4A (1), a silicon oxide film 32 having a thickness of 1500 Å was formed by the plasma CVD method. Herein, the silicon substrate 31 was P-type and had a diameter of 4 inches, a thickness of 525 μm, and a specific resistance of 10 to 15 Ω·cm. In the plasma CVD method, $SiH_4$ and $N_2O$ were used as reactive gases, and these reactive gases were irradiated with a low frequency of 50 kHz frequency at an output of 4 kW to generate plasma. Further, the growth temperature of the silicon oxide film 32 was 380° C.

A photosensitive resist was applied on the silicon oxide film 32. In this application, a spin coater at a rotation speed of 2000 rpm was used and the applied photosensitive resist had a thickness of 3000 Å. After the application, heat treatment was conducted at 100° C. for 15 minutes, to form a resist film 33 (FIG. 4A(2)).

Next, as shown in FIG. 4A(3), the resist film 33 was irradiated with a light with short wavelength (wavelength: 436 nm) using a stepper. Herein, a quartz mask 34 having been patterned to have an opening 35 was used.

Subsequently, the resist film 33 was patterned by being immersed in a developer comprising organic alkali (tetramethylammonium hydroxide).

Next, a portion of a silicon oxide film 32, which was uncoated with the resist film 33, was etched by RIE (Reactive Ion Etching) dry etching, and only a silicon oxide film 36 coated with the resist film was left.

Herein, in the dry etching, a high frequency of 13.56 MHz, and $CHF_3$ as an etching gas were used. Further, a mark for the alignment of masks was simultaneously formed. In the subsequent resist exposure process, the alignment of masks was done by using this mark. This prevented misalignment of films formed and patterned in the subsequent processes.

The resist film left on the silicon oxide film 36 was immersed in a resist stripper to be removed. Next, phosphorus was ion-implanted, by means of an ion implanter, into a portion of the silicon substrate 31, which was uncoated with the silicon oxide film 36 (FIG. 4A(4)). Herein, an accelerating voltage of phosphorus was 100 KeV and a dose amount thereof was $5 \times 10^{12}/cm^2$.

Figure 4B:
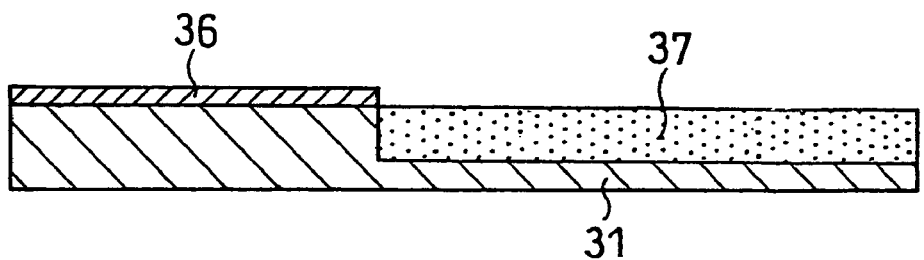
Figure 4B:
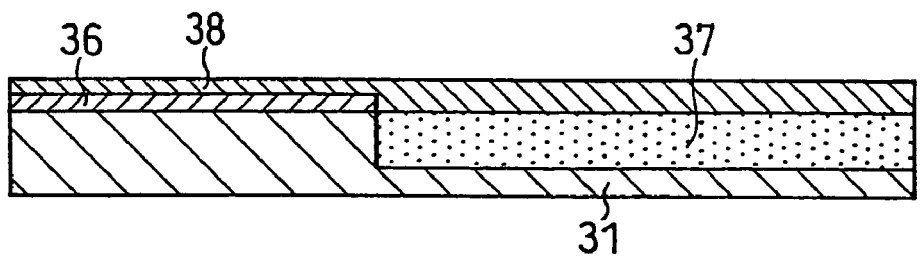
Figure 4B:
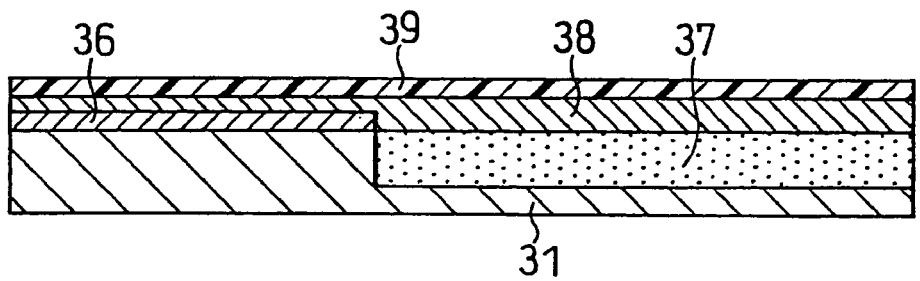
Figure 4B:
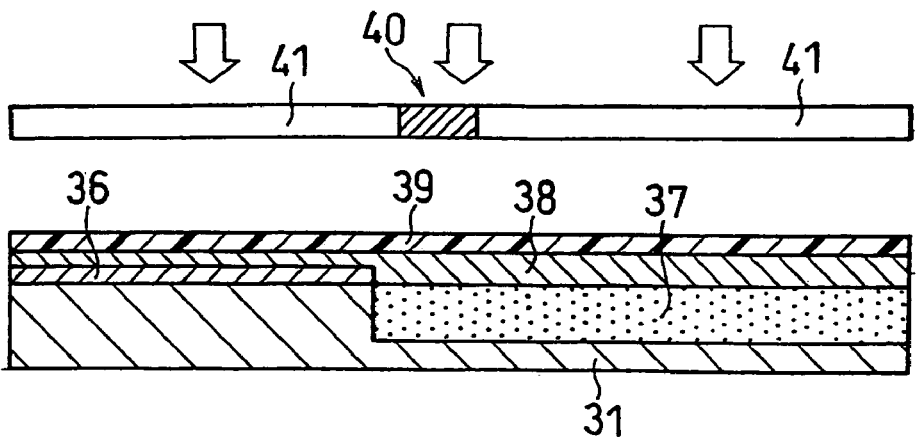

Thereafter, heat treatment was conducted in a furnace at 1000° C. for 1 hour to form a second diffusion layer 37 containing the N-type impurity (FIG. 4B(5)). Herein, the formed second diffusion layer 37 had a depth of 3 μm and an area of 100 $mm^2$ (10 mm (length)×10 mm (width)). Further, the concentration of the N-type impurity contained in the second diffusion layer 37 was measured, using SIMS (Secondary Ion Mass Spectrometry), to be $1\times10^{16}/cm^3$.

Next, a silicon oxide film 38 having a thickness of 1500 Å was formed on the silicon oxide film 36 and the second diffusion layer 37, using the plasma CVD method (FIG. 4B(6)). Herein, in the plasma CVD method, $SiH_4$ and $N_2O$ were used as reactive gases, and these reactive gases were irradiated with a low frequency of 50 kHz frequency at an output of 4 kW to generate plasma. Further, the growth temperature of the silicon oxide film 38 was 380° C.

A photosensitive resist was applied on the silicon oxide film 38 so as to have a thickness of 3000 Å. In this application, a spin coater at a rotation speed of 2000 rpm was used. Subsequently, heat treatment was conducted at 100° C. for 15 minutes, to form a resist film 39 (FIG. 4B(7)).

Using a quartz mask 40 having been patterned to have an opening 41, the resist film 39 was irradiated with a light with short wavelength (FIG. 4B(8)). Herein, a stepper was used for the irradiation of the light with short wavelength. Thereafter, the resist film 39 was patterned by being immersed in a developer comprising organic alkali (tetramethylammonium hydroxide). Thereby, the resist film 39 over a portion for forming the first diffusion layer was removed.

Next, the silicon oxide film 38 on the portion with the resist film 39 removed was etched by RIE dry etching to be removed. By this removal, the silicon substrate in the portion for forming the first diffusion layer was exposed. Thereafter, the remaining resist film 39 was immersed in a resist stripper to be removed.

Herein, in the dry etching, a high frequency of 13.56 MHz and $CHF_3$ as an etching gas were used.

In the silicon-substrate-exposed portion formed in the above-described manner, arsenic as the N-type impurity was ion planted using an ion planter. Herein, an accelerating voltage of arsenic was 40 KeV and a dose amount thereof was $4\times10^{15}/cm^2$ (FIG. 4C(9)).

Figure 4C:
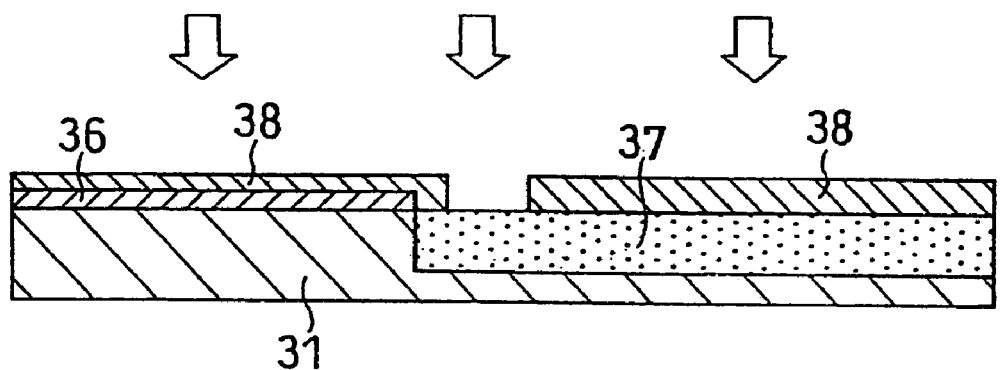
Figure 4C:
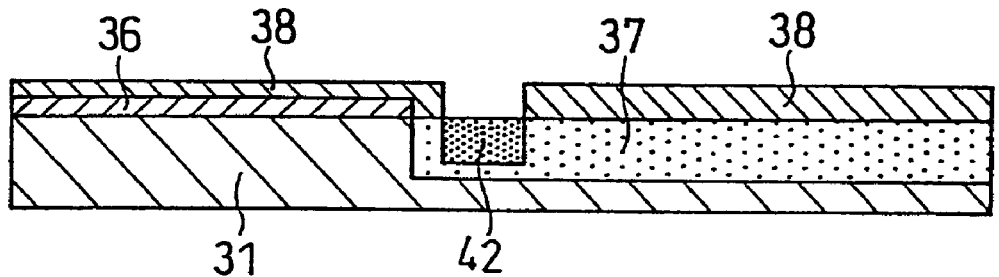
Figure 4C:
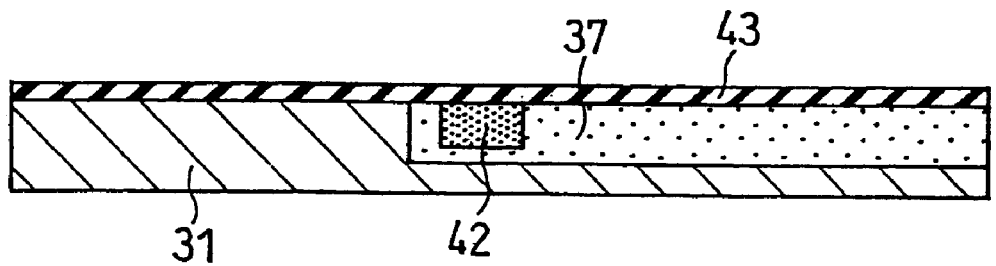

In this manner, the first diffusion layer 42 containing the N-type impurity was formed (FIG. 4C(10)). Herein, the first diffusion layer 42 had a depth of 0.2 μm and an area of 4.75 $mm^2$ (0.5 mm (length)×9.5 mm (width)). Further, the concentration of the N-type impurity (in this case, phosphorous and arsenic) contained in the first diffusion layer 42 was measured, using SIMS, and as a result of the measurement, the impurity concentration was $1\times10^{20}/cm^3$. Accordingly, the ratio of the concentration of the N-type impurity in the first diffusion layer to the concentration of the N-type impurity in the second diffusion layer was $1\times10^4/cm^3$.

Next, the silicon oxide films 36 and 38 were removed by being immersed in an aqueous solution of hydrofluoric acid (5 vol %) for 10 minutes.

The steps up to here were performed simultaneously with the formation of the integrated circuit (MOS transistor).

Next, on the silicon substrate 31 where the first diffusion layer and the second diffusion layer were formed, a polyimide film 43 having a thickness of 1 μm was formed using a spin coater at a rotation speed of 1000 rpm (FIG. 4C(11)).

Thereafter, using the photolithography technique as described above, the polyimide film 43 was patterned to have dimensions: 15 mm (length)×15 mm (width) (area: 225 $mm^2$). In this manner, the portion of the silicon substrate where the first diffusion layer 42 was formed was exposed.

Next, a metallic aluminum film having a thickness of 1 μm and an area of 81 $mm^2$ (9 mm (length)×9 mm (width)) was formed on the portion of the silicon substrate where the first diffusion layer 42 was formed, and the polyimide film 43, using a vacuum vapor deposition device with a chamber internal pressure of 10 m Torr. This metallic aluminum film was patterned using the above-described photolithography technique and RIE dry etching device, to form a positive electrode current collector film 45 and a wiring layer 44 connected to the first diffusion layer 42 (FIG. 4D(12)).

A film comprising $LiCoO_2$ was formed on the positive electrode current collector film 45 by RF magnetron sputtering method. Herein, a prescribed metallic mask (made of SUS304) was used so that the film formed had a thickness of 5 μm and an area of 64 $mm^2$ (8 mm (length)×8 mm (width)). Further, in the sputtering, the output of the irradiation beam to a target was 200 W, a mixed gas of Ar and $O_2$ was used as a sputtering gas ($Ar:O_2=3:1$), the amount of the sputtering gas introduced was 20 SCCM and the internal pressure of the chamber was 20 m Torr.

Subsequently, the film comprising $LiCoO_2$ was annealed at 400% for 2 hours to form a positive electrode film 46.

On the positive electrode film 46, a solid electrolyte film 47 comprising $Li_2S$—$SiS_2$—$Li_3PO_4$ and having a thickness of 2 μm was formed. Subsequently, on the solid electrolyte film 47, a negative electrode film 48 comprising graphite and having a thickness of 5 μm was formed. In the formation of the solid electrolyte film 47 and the negative electrode film 48, a laser ablation method was used. In the laser ablation method, the internal pressure of the chamber was $10^{-2}$ Torr and the temperature of the silicon substrate 31 was 800° C. As the laser used was a YAG laser having a wavelength of 266 nm and an energy density of 2025 $mJ/cm^2$. The repetition frequency of the YAG laser was 10 Hz and the number of shots thereof was 36000.

Using the above-described photolithography technique and RIE dry etching, the solid electrolyte film 47 and the negative electrode film 48 were patterned to have an area of 49 $mm^2$ (7 mm (length)×7 mm (width)).

Figure 4D:
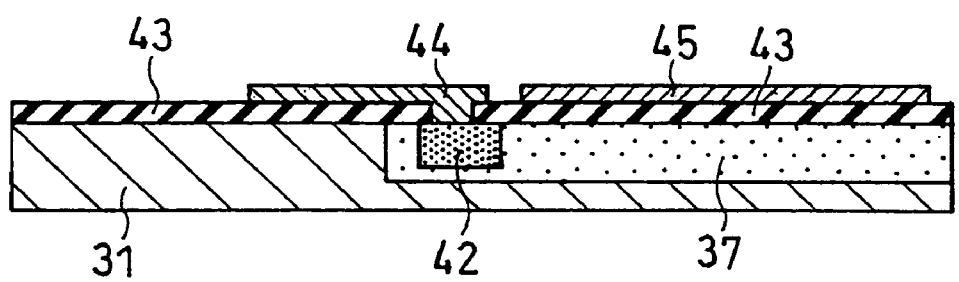
Figure 4D:
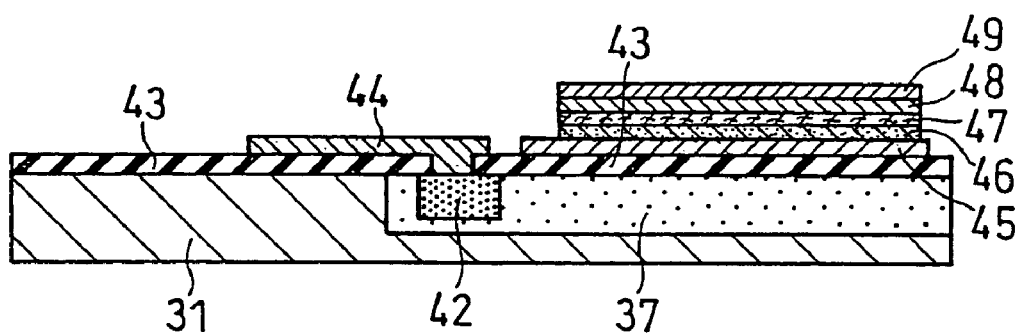
Figure 4D:
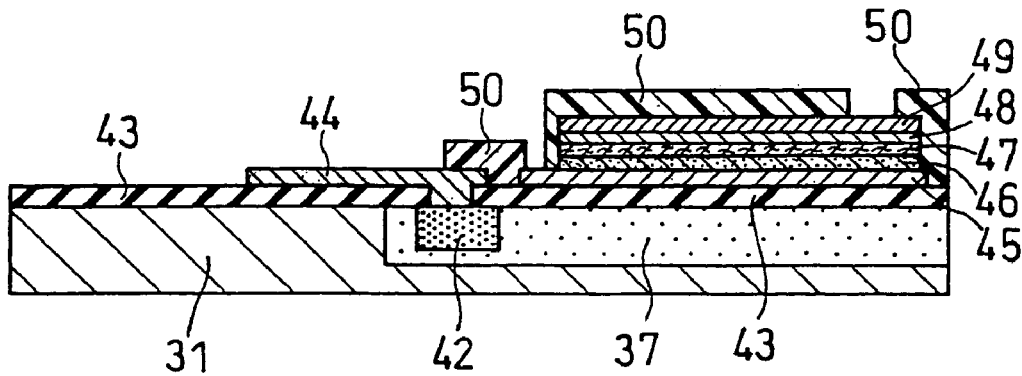

On the negative electrode film 48, a negative electrode current collector film 49 comprising metallic copper was formed by the vacuum deposition method (FIG. 4D(13)). Herein, using a metallic mask (made of SUS304) patterned to be in a prescribed from, the negative electrode current collector film 49 was made to have a thickness of 1 μm and an area of 49 $mm^2$ (7 mm (length)×7 mm (width)). A capacity of the battery obtained here was 300 μAh.

Onto the silicon substrate 31 where the solid state battery was formed, a liquid epoxy resin (CEL-C-1102, manufactured by Hitachi Chemical Co., Ltd.) was applied so as to be 1 μm thick, using a spin coater at a rotation number of 1500 rpm. Subsequently, the applied liquid epoxy resin was heat cured at 150° C. for 3 hours to form a surface protective layer 50. Finally, using the above-described photolithography technique and the RIE dry etching device, the surface protective layer 50 was patterned as shown in FIG. 4D(14) to obtain a battery mounted integrated circuit device. The obtained battery mounted integrated circuit device was referred to as Device 1.

EXAMPLE 2

The battery mounted integrated circuit device as shown in FIG. 2 was produced in the same manner as in Example 1, except that the first diffusion layer and the wiring layer were formed so as to surround the solid state battery mounted region. The battery mounted integrated circuit device as thus obtained was referred to as Device 2.

[Evaluation]

In Devices 1 and 2 described above, the solid state battery was charged/discharged in such a state that a positive potential (5V) not less than the potential of the positive electrode with respect to the negative electrode was being applied, using an external power source, to the first diffusion layer and the second diffusion layer. Here examined was the presence or absence of abnormalities in the basic characteristics of adjacent P-type and N-type MOS transistors.

As the basic characteristics, the $V_d$-$I_d$ characteristic and the on-voltage characteristic were investigated.

[$V_d$-$I_d$ Characteristic]

First, voltages of 0 V to 5 V were successively applied to a drain of the N-type MOS transistor, with a voltage of 0 V, 1 V, 2 V, 3 V, 4 V or 5 V applied to the gate, to measure a flowing drain current.

[On-Voltage]

With a voltage of 5 V applied to the drain, a voltage to be applied to the gate (gate voltage) was increased and the gate voltage to make the drain current 1 μA was measured.

In any of the measurements, the measured value was the same as the design value of the 5 V-level N-type MOS transistor.

A P-type MOS transistor was also examined on $V_d$-$I_d$ characteristic and the on-voltage characteristic, in the same manner as above.

A voltage of 0 V to −5 V was successively applied to a drain, with a voltage of 0 V, −1 V, −2 V, −3 V, −4 V, or −5V applied to the gate, to measure a flowing drain current.

Also, with a voltage of −5 V applied to the drain, a voltage to be applied to the gate (gate voltage) was increased in the minus direction, and the gate voltage to make the drain current −1 μA was measured.

In any of the measurements, the measured value was the same as the design value of the 5 V-level P-type MOS transistor.

As thus described, no abnormality was observed in the basic characteristic of the MOS transistors.

Furthermore, a battery mounted integrated circuit device was produced in the same manner as in Example 1, except that the ratio of the concentration of the N-type impurity in the first diffusion layer to the concentration of the N-type impurity in the second diffusion layer was $1\times10^1$, $1\times10^2$, $1\times10^3$ or $1\times10^5$. The obtained devices were referred to as Device 3, Device 4, Device 5 and Device 6, respectively. It is to be noted that the concentration of the N-type impurity in the first diffusion layer was $1\times10^{19}$/cm$^3$.

In the same manner as above, the $V_d$-$I_d$ characteristic and the on-voltage characteristic were measured in Devices 3 to 6.

As a result, in any device, abnormality in the basic characteristic of the MOS transistors was not observed.

As thus described, the battery mounted integrated circuit device of the present invention is capable of effectively preventing an integrated circuit, formed on the same substrate as a solid state battery, from being contaminated by ions serving to charge/discharge the solid state battery.

In the above described was a device where an integrated circuit comprising semiconductor devices and a solid state battery are formed on a semiconductor substrate. The present invention can be applied not only to the case of mounting an integrated circuit comprising semiconductor devices, but to the case of mounting an integrated circuit comprising electronic devices.

Moreover, the present invention can be applied not only to the case of using the semiconductor substrate, but to the case of using any substrate where lithium ions diffuse.

Furthermore, the present invention can be applied not only to a lithium-ion battery, but to a solid state battery where alkaline metal ions serve to charge/discharge the battery.

INDUSTRIAL APPLICABILITY

According to the present invention, a battery mounted integrated circuit device can be provided which can effectively prevent deterioration in characteristic of a semiconductor device and improper operation of the semiconductor device, caused by diffusion of ions serving to charge/discharge the solid state battery in the semiconductor substrate.

The invention claimed is:

1. A battery mounted integrated circuit device, comprising:
    (1) a semiconductor substrate;
    (2) a solid state battery mounted on said semiconductor substrate;
    (3) an integrated circuit mounted on said semiconductor substrate;
    (4) a first diffusion layer, containing an N-type impurity, formed between a region of said semiconductor substrate where said solid state battery is mounted and a region of said semiconductor substrate where said integrated circuit is mounted; and
    (5) a second diffusion layer, containing an N-type impurity, formed below said region of said semiconductor substrate where said solid state battery is mounted, and overlapping with said first diffusion layer, wherein:
    said solid state battery comprises a positive electrode, a negative electrode, and a solid electrolyte disposed between said positive electrode and said negative electrode,
    the concentration of said N-type impurity in said first diffusion layer is higher than the concentration of said N-type impurity in said second diffusion layer,
    at least when said solid state battery is being charged and discharged, said first diffusion layer and said second diffusion layer have a positive potential not less than the potential of the positive electrode with respect to the negative electrode,
    said solid state battery is carried on the second diffusion layer, and
    said first diffusion layer surrounds said region where said solid state battery is mounted.

2. The battery mounted integrated circuit device in accordance with claim 1, wherein the concentration of said N-type impurity in said first diffusion layer is not less than $1\times10^{19}$ atoms/cm$^3$.

3. The battery mounted integrated circuit device in accordance with claim 1, wherein the ratio of the concentration of said N-type impurity in said first diffusion layer to the concentration of said N-type impurity in said second diffusion layer is not less than $1\times10^1$ and not more than $1\times10^5$.

4. The battery mounted integrated circuit device in accordance with claim 1, further comprising a wiring layer for connecting said first diffusion layer with the outside.

5. The battery mounted integrated circuit device in accordance with claim 1, further comprising a potential controlling section for controlling a potential to be applied to said first diffusion layer and said second diffusion layer.

* * * * *